United States Patent
Lin

(10) Patent No.: US 10,170,334 B2
(45) Date of Patent: Jan. 1, 2019

(54) REDUCTION OF DISHING DURING CHEMICAL MECHANICAL POLISH OF GATE STRUCTURE

(71) Applicant: TAIWAN SEMICONDUCTOR MANUFACTURING CO., LTD., Hsinchu (TW)

(72) Inventor: Ta-Wei Lin, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/489,875

(22) Filed: Apr. 18, 2017

(65) Prior Publication Data

US 2018/0301348 A1    Oct. 18, 2018

(51) Int. Cl.
*H01L 21/321* (2006.01)
*H01L 21/8234* (2006.01)
*H01L 27/088* (2006.01)
*H01L 29/66* (2006.01)
*H01L 29/40* (2006.01)

(52) U.S. Cl.
CPC .. *H01L 21/3212* (2013.01); *H01L 21/823418* (2013.01); *H01L 21/823431* (2013.01); *H01L 27/0886* (2013.01); *H01L 29/401* (2013.01); *H01L 29/66545* (2013.01)

(58) Field of Classification Search
CPC ......... H01L 21/3212; H01L 21/823418; H01L 21/823431; H01L 27/0886; H01L 29/401; H01L 29/66545
See application file for complete search history.

(56) References Cited

U.S. PATENT DOCUMENTS

| 9,748,144 | B1* | 8/2017 | Lin | H01L 21/823456 |
| 2010/0038617 | A1* | 2/2010 | Nakajima | H01L 27/24 257/2 |
| 2013/0164930 | A1* | 6/2013 | Tu | H01L 21/31053 438/595 |
| 2016/0104708 | A1* | 4/2016 | Kim | H01L 27/0924 257/369 |
| 2016/0293728 | A1* | 10/2016 | Seo | H01L 29/66545 |
| 2017/0330947 | A1* | 11/2017 | Hsiao | H01L 29/4238 |
| 2017/0330948 | A1* | 11/2017 | Hsiao | H01L 29/4238 |

* cited by examiner

*Primary Examiner* — Christine A Enad
(74) *Attorney, Agent, or Firm* — McClure, Qualey & Rodack, LLP

(57) ABSTRACT

A semiconductor device includes a semiconductor substrate, a gate structure and at least one CMP resistant structure. The gate structure is over the semiconductor substrate. The CMP resistant structure is embedded in a top surface of the gate structure. The CMP resistant structure has a CMP resistance property different from a CMP resistance property of the gate structure.

20 Claims, 19 Drawing Sheets

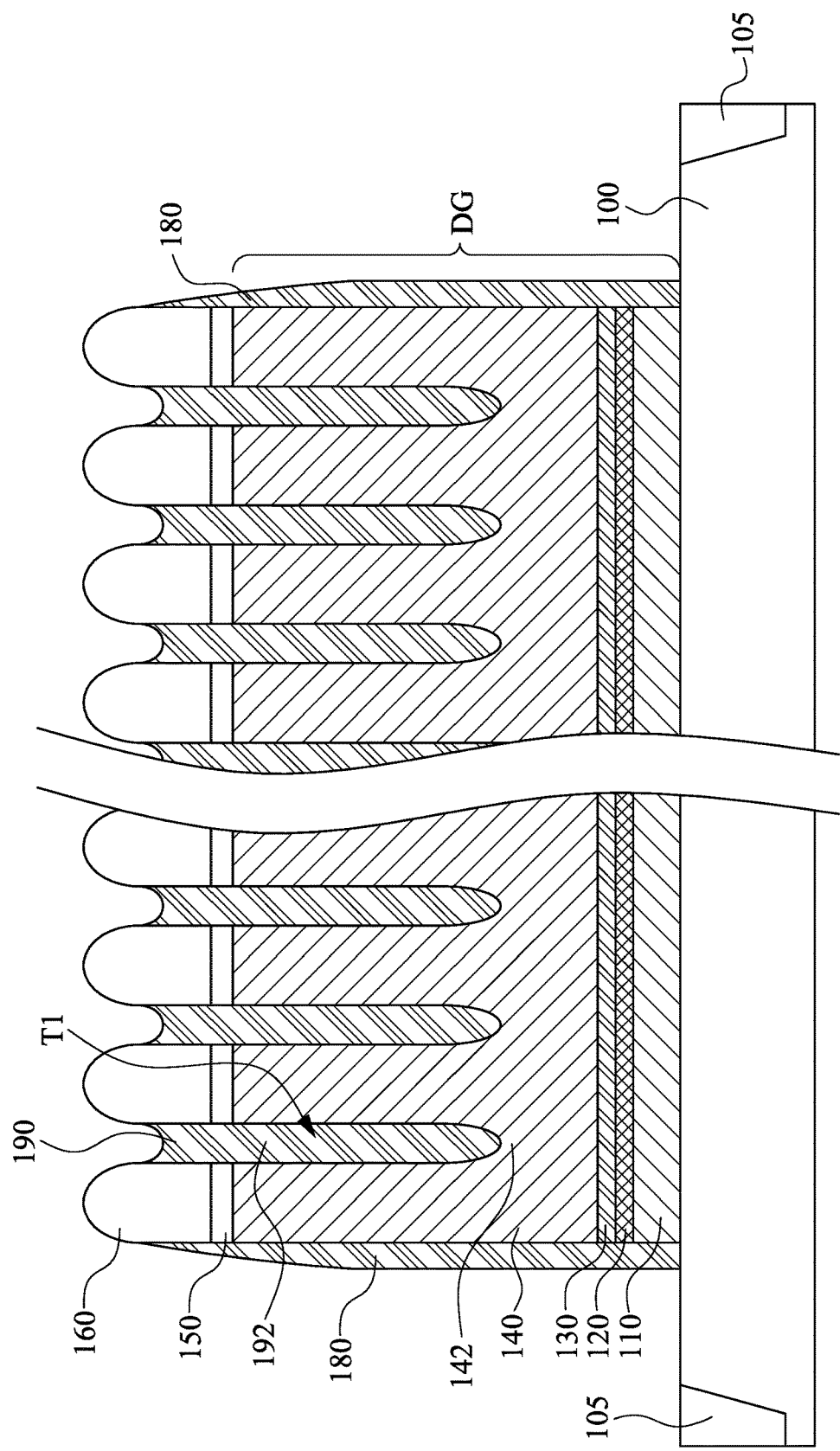

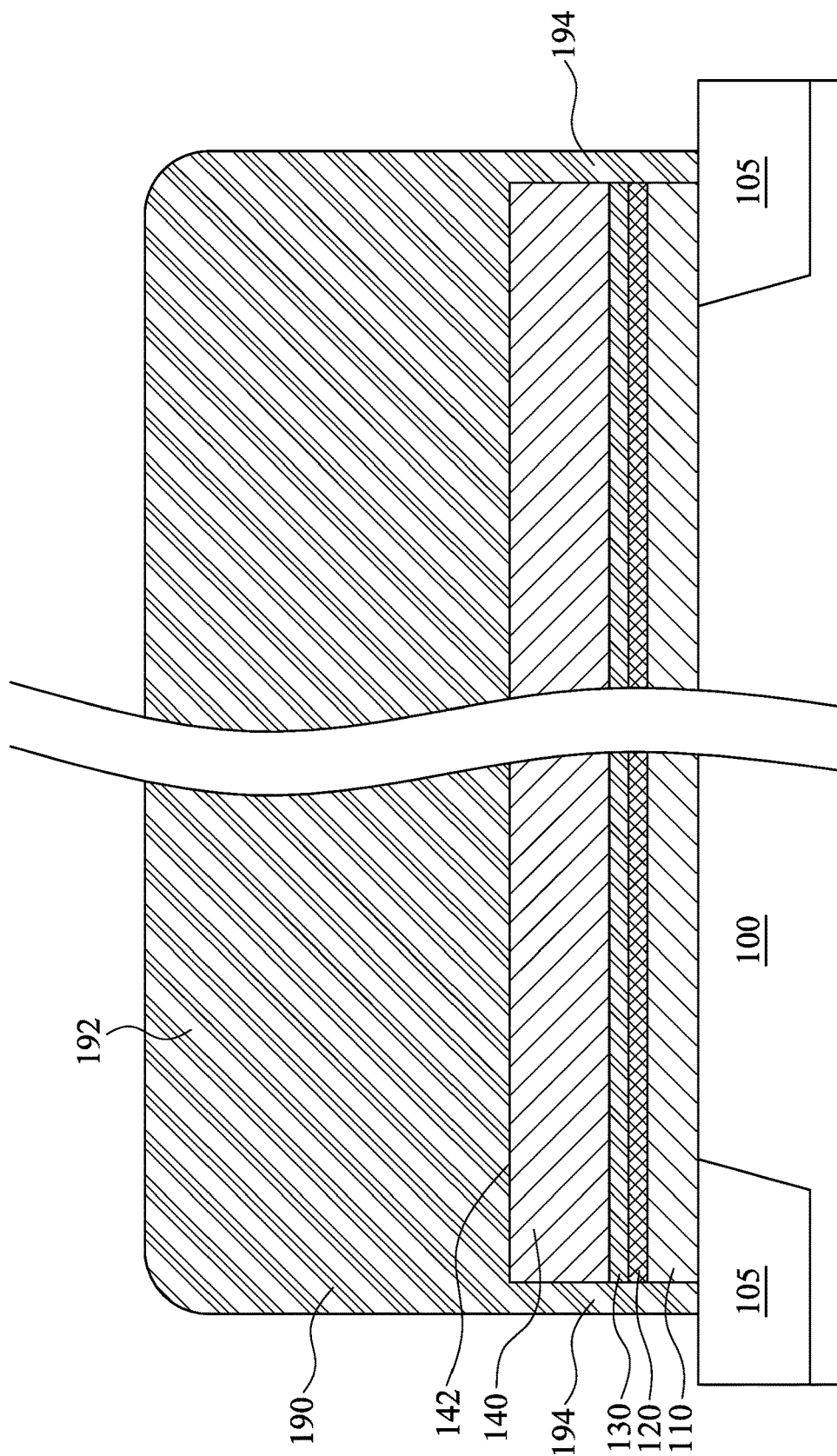

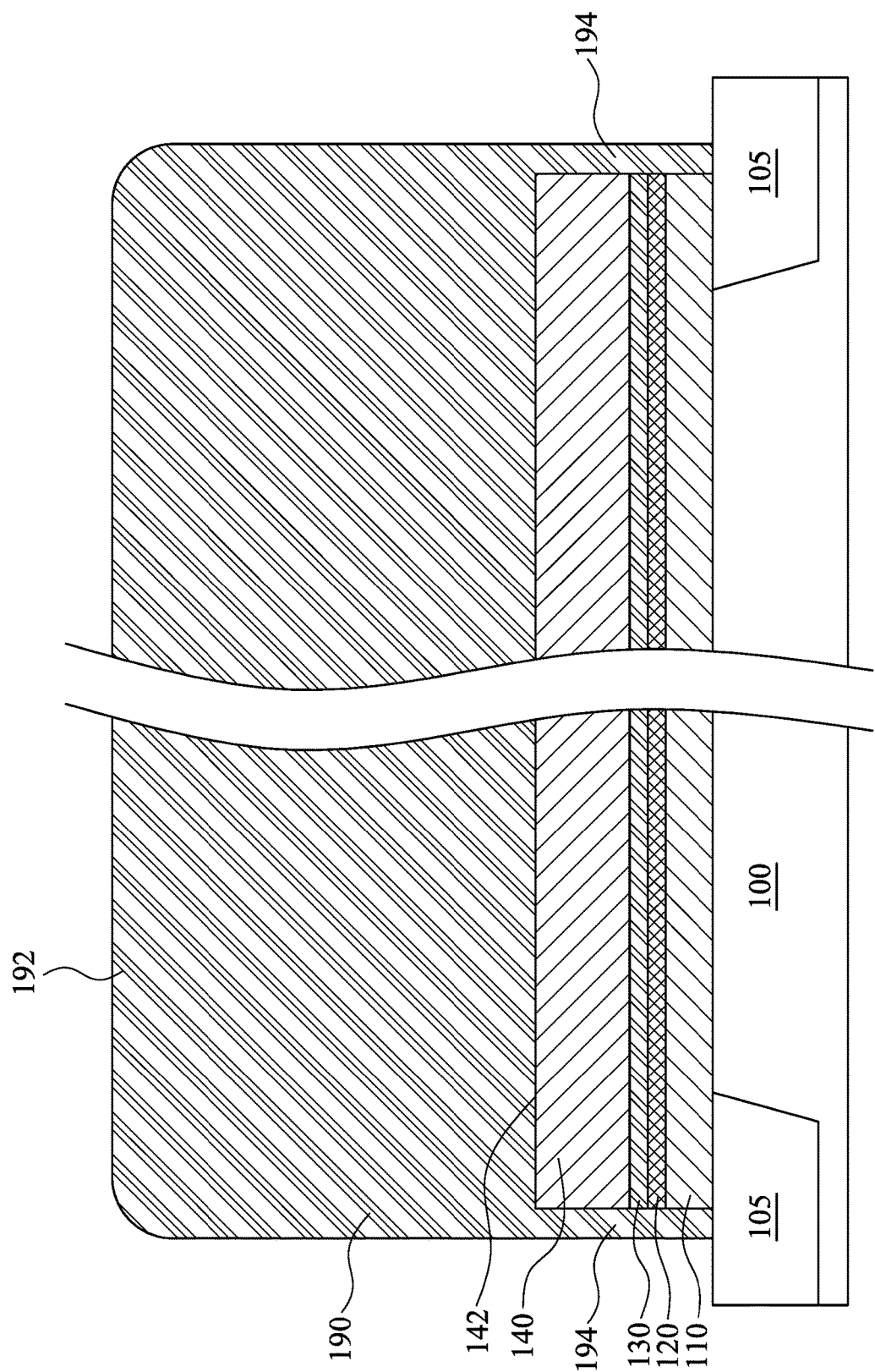

REDUCTION OF DISHING DURING CHEMICAL MECHANICAL POLISH OF GATE STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement or "gate last" process in which the final gate stack is fabricated "last" which allows for reduced number of subsequent processes, including high temperature processing, that is performed after formation of the gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-11B illustrate a method of fabricating a semiconductor device in accordance with some embodiments.

DETAILED DESCRIPTION

Figure 1:
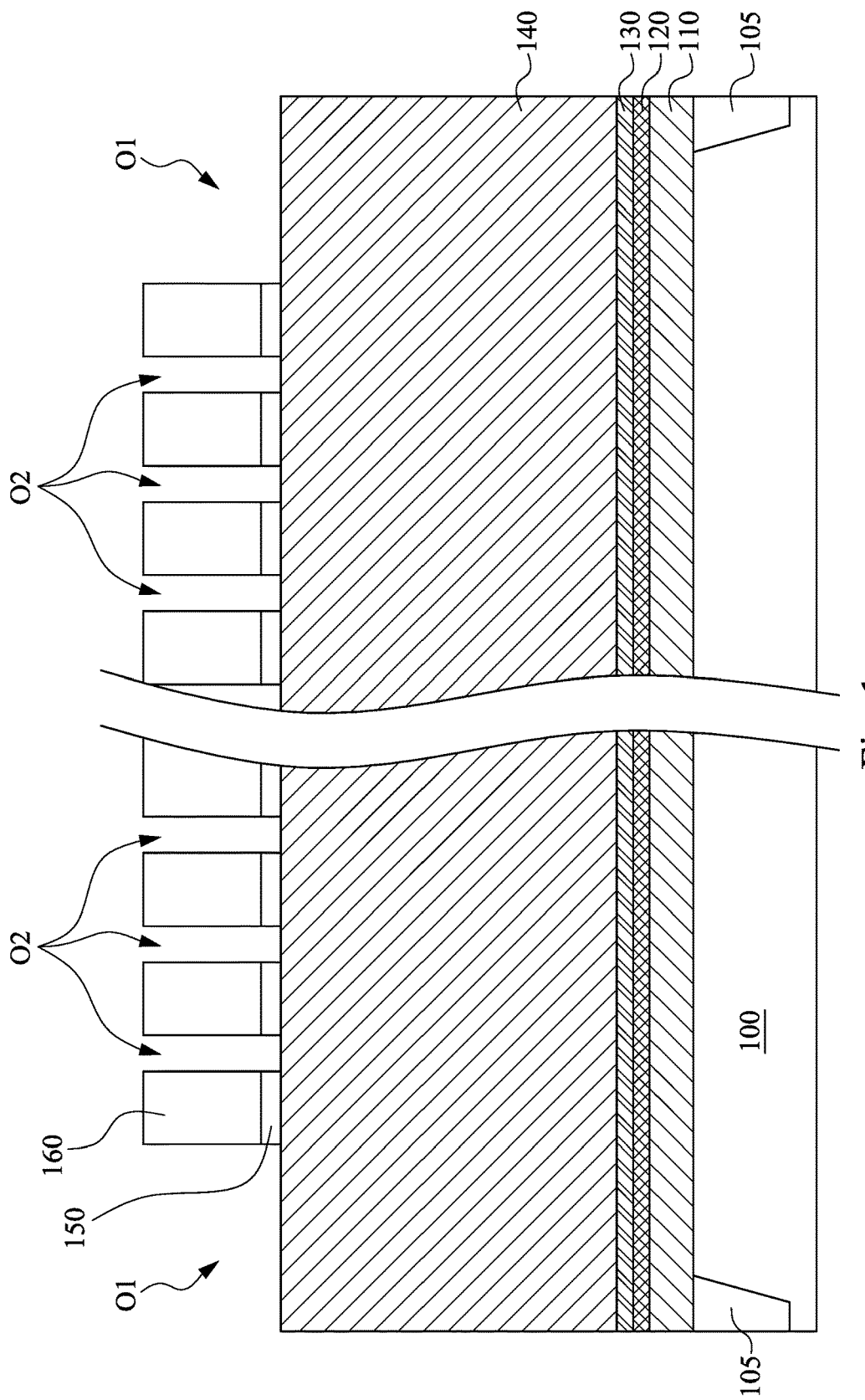

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure may be advantageous to reduce dishing during a chemical mechanical polish (CMP) process performed to a replacement gate. These embodiments are discussed below in the context of forming a high voltage (HV) device with a long gate length. In some embodiments, the HV device is supplied with, and is configured to endure, a positive power supply voltage higher than the positive power supply voltage of other devices, such as logic devices or memory devices. One of ordinary skill in the art will realize that embodiments of the present disclosure may be used to other devices, such as radio frequency (RF) devices or analog devices.

Illustrated in FIGS. 1-11B is a method of fabricating a semiconductor device in accordance with some embodiments. The method may be used to implement a replacement gate methodology on a semiconductor device. It is understood that the method includes steps having features of a complementary metal-oxide-semiconductor (CMOS) technology process flow and thus, are described briefly herein. Additional steps may be performed before, after, and/or during the method.

FIG. 1 illustrates a semiconductor device at an intermediate stage during the fabricating method thereof. As shown in FIG. 1, a gate dielectric layer 110 is formed over a semiconductor substrate 100 with an isolation dielectric 105. In some embodiments, the semiconductor substrate 100 includes crystalline silicon. Other commonly used materials such as carbon, germanium, gallium, boron, arsenic, nitrogen, indium, phosphorus, and/or the like, may also be included in semiconductor substrate 100. The semiconductor substrate 100 may be a bulk substrate or a semiconductor-on-insulator (SOI) substrate. In some exemplary embodiments, the semiconductor substrate 100 comprises $Si_{1-z}Ge_z$, wherein value z is the atomic percentage of germanium in SiGe, and may be any value ranging from, and including, 0 and 1. For example, when value z is 0, the semiconductor substrate 100 comprises a crystalline silicon substrate. When value z is 1, semiconductor substrate 100 comprises a crystalline germanium substrate. The semiconductor substrate 100 may also have a compound structure including a III-V compound semiconductor on a silicon substrate, or a silicon germanium (or germanium) layer on a silicon substrate.

In some embodiments, the isolation dielectric 105 is a shallow trench isolation (STI) structure embedded in the semiconductor substrate 100. The isolation dielectric 105 may include any suitable dielectric material, such as silicon oxide. The method of forming the isolation dielectric 105 may include forming one or more trenches into the semiconductor substrate 100, depositing the isolation dielectric 105 into the one or more trenches of the semiconductor substrate 100, and optionally performing a planarization process to remove the excess isolation dielectric 105 outside the one or more trenches.

In some embodiments, the gate dielectric layer 110 is formed using thermal oxidation by oxidizing semiconductor substrate 100. In alternative embodiments, the gate dielectric layer 110 is formed using chemical vapor deposition (CVD) method such as PECVD, low pressure CVD (LPCVD), atomic layer deposition (ALD), or the like. In some embodiments, the gate dielectric layer 110 may include silicon oxide, silicon oxynitride, or the like.

Next, a high-k dielectric layer 120, a capping layer 130, and a dummy gate electrode 140 are formed sequentially over the gate dielectric layer 110. The high-k dielectric layer 120 may have a dielectric constant (k value) greater than about 7.0, and may include an oxide or a silicate of Hf, Al, Zr, La, Mg, Ba, Ti, Pb, Yb, Pr, Nd, Gd, Er, Dy, or combinations thereof. Exemplary materials of the high-k dielectric layer 120 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The formation methods of the high-k dielectric layer 120 may include molecular-beam deposition (MBD), Physical Vapor Deposition (PVD), ALD, or the like.

Over the high-k dielectric layer 120, the capping layer 130 may be formed. In some embodiments, the capping layer 130 comprises titanium nitride (TiN). In alternative embodiments, the exemplary materials of the capping layer 130 include tantalum-containing materials and/or titanium-containing materials such as TaC, TaN, TaAlN, TaSiN, and combinations thereof.

The dummy gate electrode 140 is then formed over capping layer 130. In some embodiments, the dummy gate electrode 140 may include polycrystalline-silicon (poly-Si), poly-crystalline silicon-germanium (poly-SiGe), metallic nitrides, metallic silicides, metallic oxides, or metals. In some embodiments, the dummy gate electrode 140 includes a metal-containing material such as TiN, TaN, TaC, Co, Ru, Al, combinations thereof, or multi-layers thereof. The dummy gate electrode 140 may be deposited by CVD, physical vapor deposition (PVD), sputter deposition, or other techniques suitable for depositing conductive materials.

One or more mask layers are then formed and patterned over the dummy gate electrode 140 as masks for patterning the dummy gate electrode 140. For example, first and second mask layers 150 and 160 are formed and patterned over the dummy gate electrode 140. The patterned mask layers 150 and 160 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). The first mask layer 150 may include silicon nitride, and the second mask layer 160 may include an oxide, as examples.

In some embodiments, the first and second mask layers 150 and 160 are patterned to form wide openings O1 and narrow openings O2 that are narrower than the wide openings O1. Because of etching loading effect, a difference between widths of the openings O1 and O2 can be great enough such that structures under the wide openings O1 can be removed to expose the semiconductor substrate 100 and the isolation dielectric 105 while trenches can be formed in portions of the dummy gate electrode 140 under the narrow openings O2.

Figure 2:
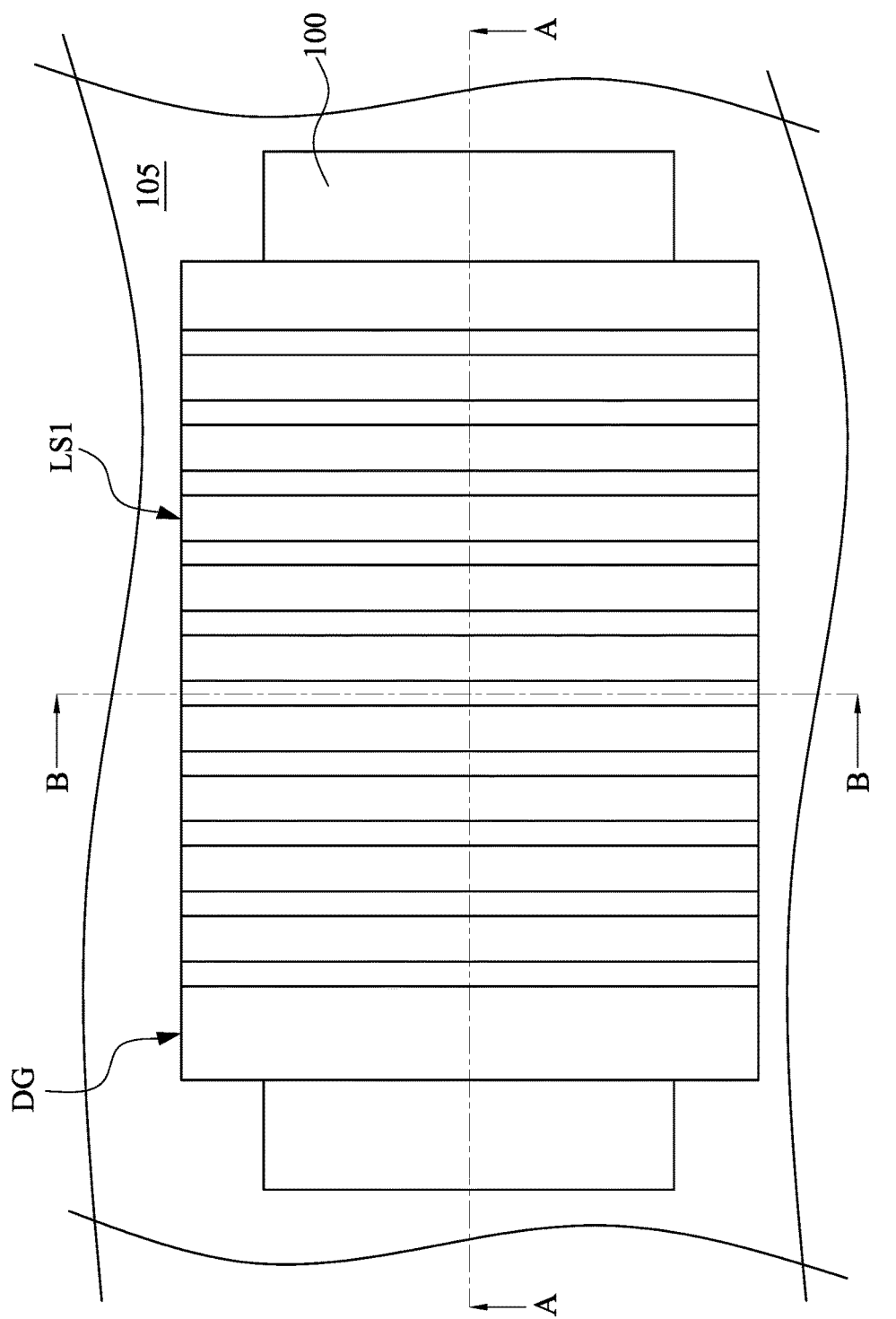
Figure 3A:
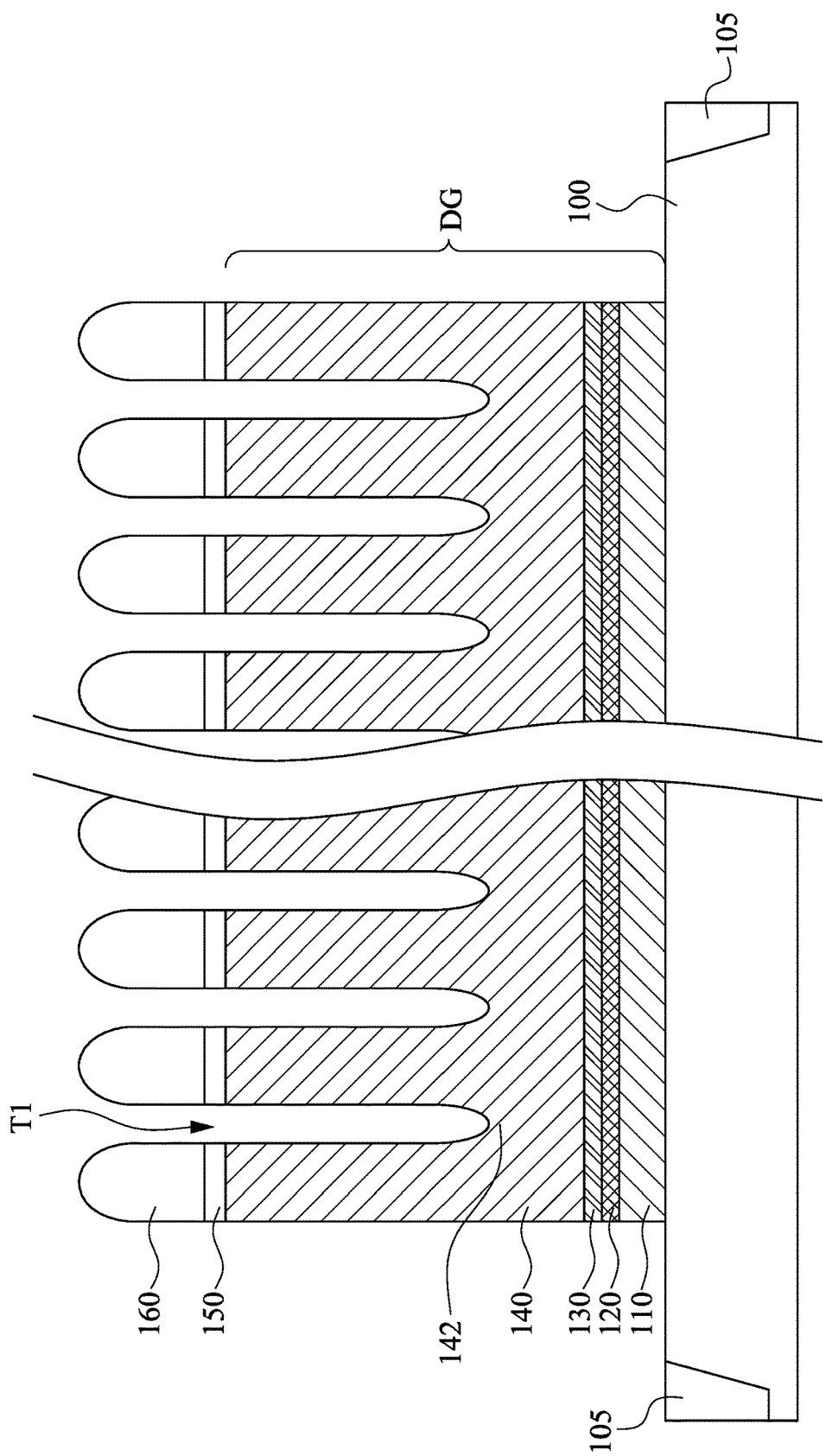
Figure 3B:
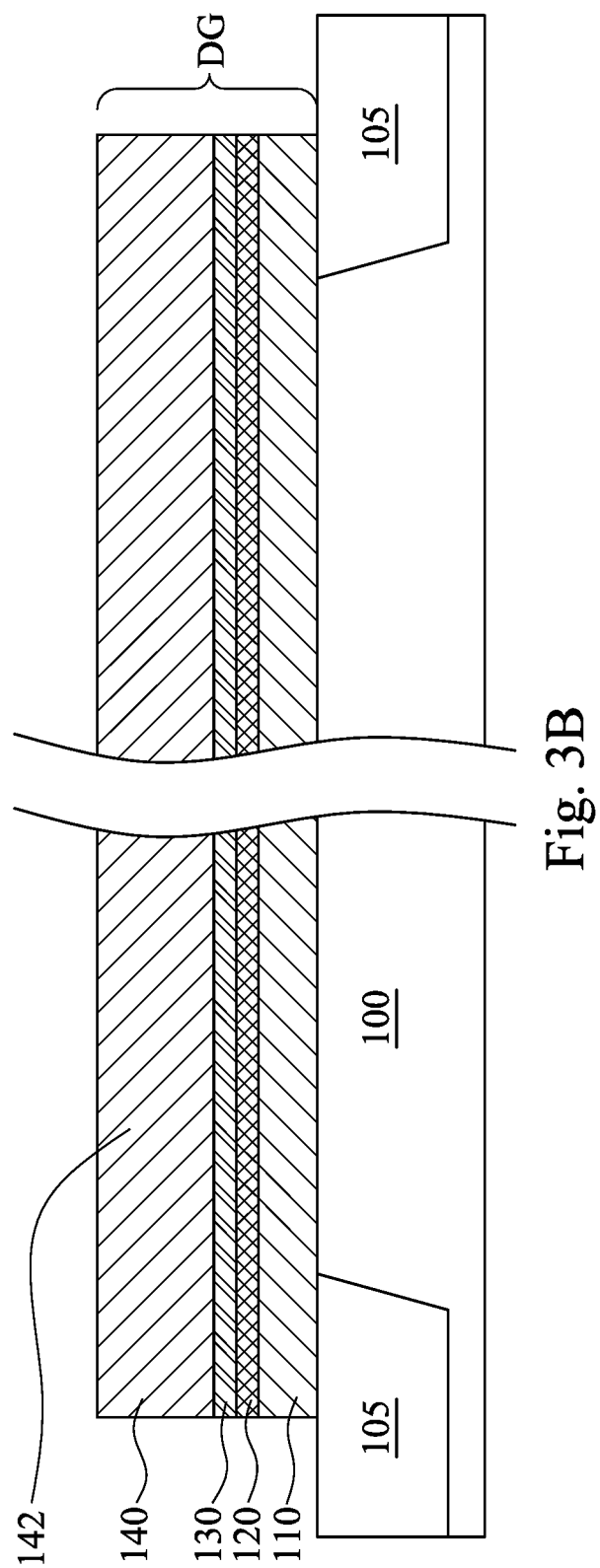

FIG. 2 is a plan view of a semiconductor device at an intermediate stage after formation of a dummy gate structure DG, FIG. 3A is a cross-sectional view of the semiconductor device taken along line A in FIG. 2, and FIG. 3B is a cross-sectional view of the semiconductor device taken along line B in FIG. 2. As illustrated, one or more etching processes are performed to pattern the gate dielectric layer 110, the high-k dielectric layer 120, the capping layer 130 and the dummy gate electrode 140, so as to form a dummy gate structure DG over the semiconductor substrate 100. The one or more etching processes may include dry etching, wet etching or combinations thereof. For example, the patterning can be performed using plasma etching at a variety of pressures, temperatures, and so forth.

As illustrated in FIGS. 1 and 3A, the dummy gate electrode 140, the capping layer 130, the high-k dielectric layer 120 and the gate dielectric layer 110 under the wide openings O1 are removed by the etching operation to expose the semiconductor substrate 100, and portions of the dummy gate electrode 140 under the narrow openings O2 are removed to form trenches T1 in the dummy gate electrode 140. The dummy gate electrode 140 under the narrow openings O2 is not etched through due to etching loading effect. In other words, portions 142 of the dummy gate electrode 140 are thinned and remain under the trenches T1 after the etching operation, and these portions 142 can be referred to as thinned portions 142 of the dummy gate electrode 140. More specifically, due to the etching loading effect, the wide openings O1 in the mask allows deeper etching depth, and the narrow openings O2 in the mask allows shallower etching depth. Therefore, if the etching operation exposes the semiconductor substrate 100 under the wide openings O1, the dummy gate electrode 140 under the narrow openings O2 may not be totally removed because the etching depth under the narrow openings O2 is shallower than the etching depth under the wide openings O1. As a result, formation of the dummy gate structure DG as well as formation of the trenches T1 in the dummy gate structure DG can be achieved by the same etching operation, and hence an additional etching process to etch trenches T1 can be omitted.

Although formation of the trenches T1 and formation of the dummy gate structure DG are achieved by the same etching operation in the depicted embodiments, they can be achieved by different etching operations in some other embodiments as well. For example, in some embodiments, a first etching operation is performed to form the dummy gate structure DG, and a second etching operation is then performed to form the trenches T1 in the dummy gate structure DG.

Figure 4A:
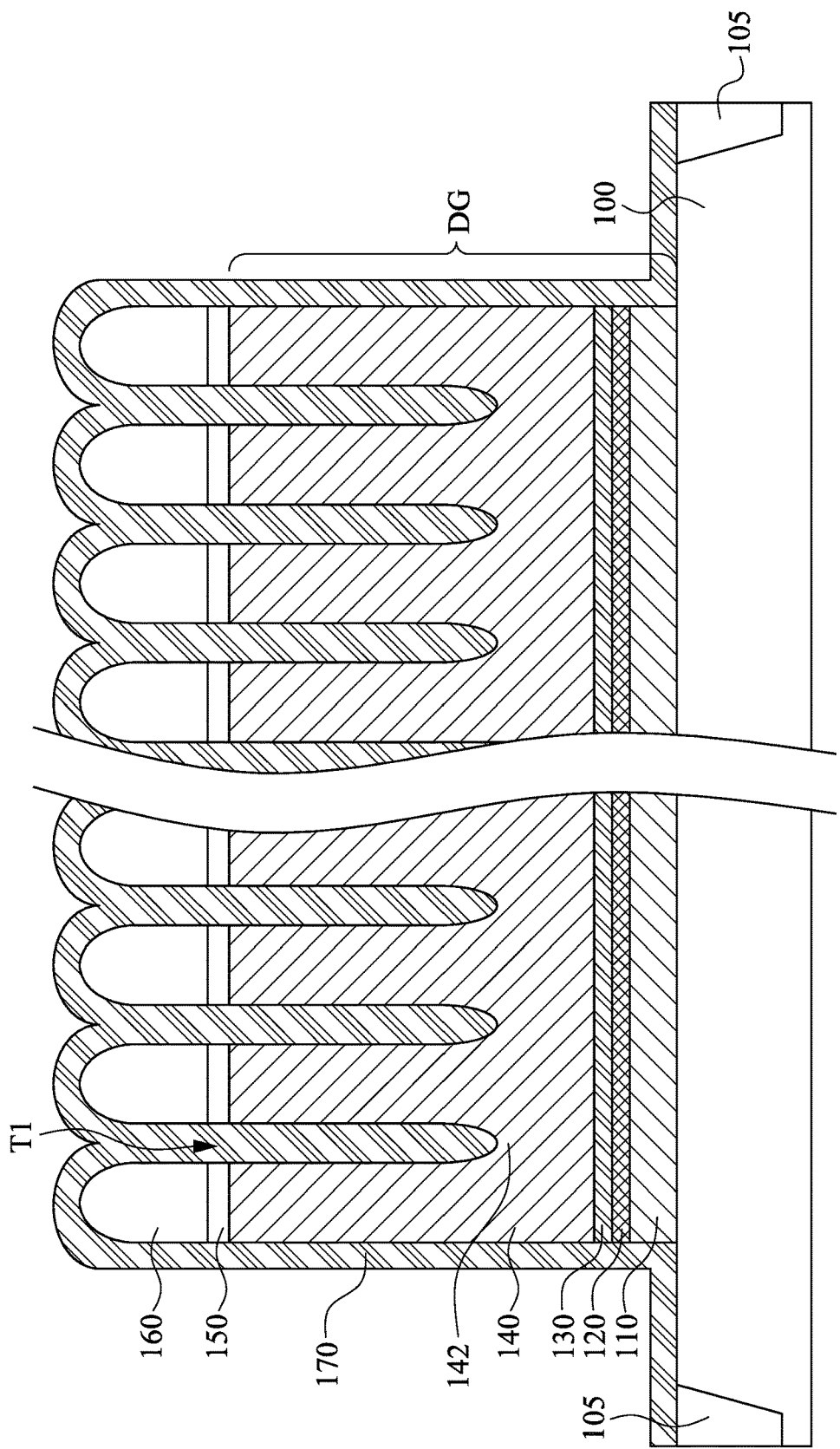
Figure 4B:
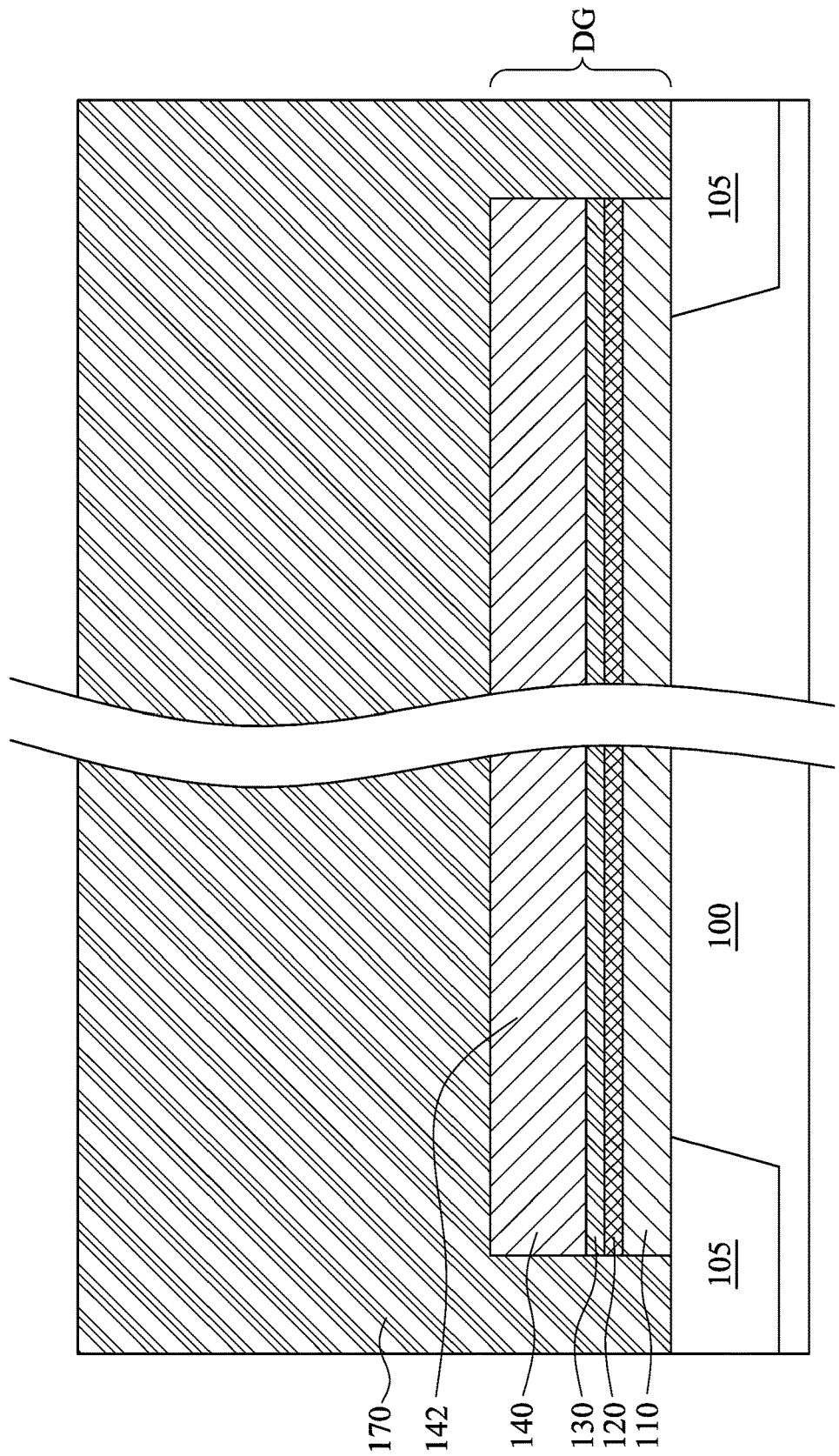

FIGS. 4A and 4B illustrate formation of a spacer layer 170 over the semiconductor substrate 100, wherein FIG. 4A is a cross-sectional view taken along line A as shown in FIG. 2, and FIG. 4B is a cross-sectional view taken along line B as shown in FIG. 2. As illustrated, a spacer layer 170 is blanket formed on the structure shown in FIG. 2. Portions of the spacer layer 170 are deposited into the trenches T1 in the dummy gate electrode 140, portions of the spacer layer 170 are formed at outer sidewalls of the dummy gate structure DG. In some embodiments, the spacer layer 170 may include silicon nitride, silicon oxide, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, other suitable dielectric material or combinations thereof. The spacer layer 170 may include a single layer or multilayer structure made of different dielectric materials. The method of forming the spacer layer 170 includes, for example, CVD, PVD or ALD.

FIGS. 5A and 5B illustrate formation of gate spacers 180 and dielectric structures 190, wherein FIG. 5A is a cross-sectional view taken along line A as shown in FIG. 2, and FIG. 5B is a cross-sectional view taken along line B as shown in FIG. 2. An etching process is performed to remove horizontal portions of the spacer layer 170 as shown in FIGS. 4A and 4B. After the etching process, portions of the spacer layer 170 remaining at the outer sidewalls of the dummy gate structure DG can serve as gate spacers 180, and portions of the spacer layer 170 remaining in the trenches T1 of the dummy gate electrode 140 are referred to as dielectric structures 190 that can be used to resist a CMP process performed to a replacement gate, as will be described in detail below.

As illustrated in FIG. 5A, dielectric structures 190 are respectively embedded in the dummy gate electrode 140. Specifically, the dielectric structures 190 are respectively embeddedly retained in the trenches T1 in the dummy gate electrode 140, and hence the dielectric structures 190 are formed over thinned portions 142 of the dummy gate electrode 140 under the trenches T1. As illustrated in FIG. 5B, the dielectric structures 190 wrap the thinned portions 142 of the dummy gate electrode 140 respectively. More particularly, the dielectric structure 190 includes a first portion 192 over a top surface of the thinned portion 142 and second portions 194 respectively abutting opposite sidewalls of the thinned portion 142, and hence the thinned portion 142 can be wrapped by the dielectric structure 190. The second portions 194 of the dielectric structure 190 have bottom ends in contact with the isolation dielectric 105 in the depicted embodiments. Alternatively, bottom ends of the second portions 194 can be in contact with the semiconductor substrate 100 in some other embodiments. In this way, the dielectric structures 190 can be supported by the isolation dielectric 105 or the semiconductor substrate 100 when the dummy gate electrode 140 is removed in subsequent steps. First portions 192 of different dielectric structures 190 are separated, as shown in FIG. 5A. In some embodiments, second portions 194 of different dielectric structures 190 on the same long side of the dummy gate electrode 140 (e.g. long side LS1 as shown in FIG. 2) are connected. In alternative embodiments, second portions 194 on the same long side of the dummy gate electrode 140 are separated.

In some embodiments, the gate spacers 180 can be used to offset subsequently formed source/drain regions on the semiconductor substrate 100. The gate spacers 180 may further be used for designing or modifying the source/drain regions (junction) profile. Since the gate spacers 180 and the dielectric structures 190 are formed from the spacer layer 170, the gate spacers 180 and the dielectric structures 190 can have the same material, such as silicon nitride. The etching of the spacer layer 170 may be, for example, anisotropic etching. A lithography process may be optionally included to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology.

Figure 6A:
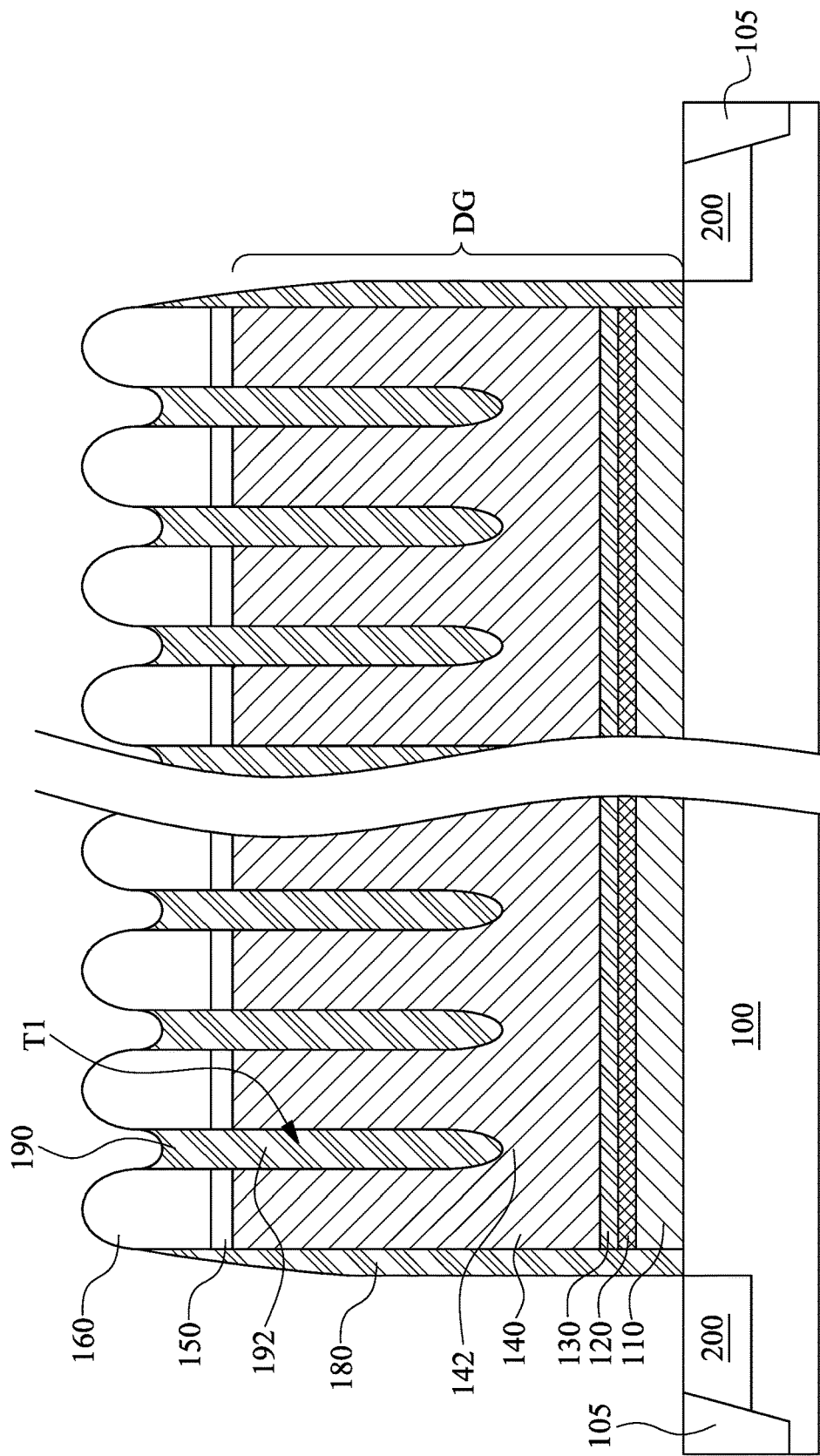

FIGS. 6A and 6B illustrate formation of source/drain regions 200, wherein FIG. 6A is a cross-sectional view taken along line A as shown in FIG. 2, and FIG. 6B is a cross-sectional view taken along line B as shown in FIG. 2. The source/drain regions 200 can be formed adjacent to the gate spacers 180 using an implantation process to dope exposed regions of the semiconductor substrate 100 that are not covered by the gate spacers 180 and the dummy gate structure DG. The doping species include P-type dopants, such as boron or $BF_2$; N-type dopants, such as phosphorus or arsenic; and/or other suitable dopants including combinations thereof. One or more annealing processes may be optionally performed to activate these source/drain regions 200. The annealing processes include rapid thermal annealing (RTA) and/or laser annealing processes.

In some embodiments, formation of the source/drain regions 200 includes forming recesses in the semiconductor substrate 100 and epitaxially growing Si features, SiGe features, silicon phosphate (SiP) features, silicon carbide (SiC) features and/or other suitable features, so that these epitaxy features can be formed in a crystalline state into the recesses of the semiconductor substrate 100. In some embodiments, lattice constants of the epitaxy source/drain regions 200 are different from a lattice constant of the semiconductor substrate 100, so that the channel region between the epitaxy source/drain regions 200 can be strained or stressed by the epitaxy source/drain regions 200 to improve carrier mobility of the semiconductor device and enhance the device performance. Although trenches T1 are formed in the dummy gate electrode 140, the trenches T1 are filled by the dielectric structures 190. Therefore, surfaces of the trenches T1 are not exposed. As a result, in some embodiments where the dummy gate electrode 140 comprises polysilicon, although polysilicon may be susceptible to the epitaxy process, the dielectric structures 190 can prevent epitaxy features from growing in the trenches T1 of the dummy gate electrode 140, and hence the dummy gate structure DG can be free of unwanted epitaxy features even if trenches T1 are formed in the dummy gate structure DG.

Figure 7A:
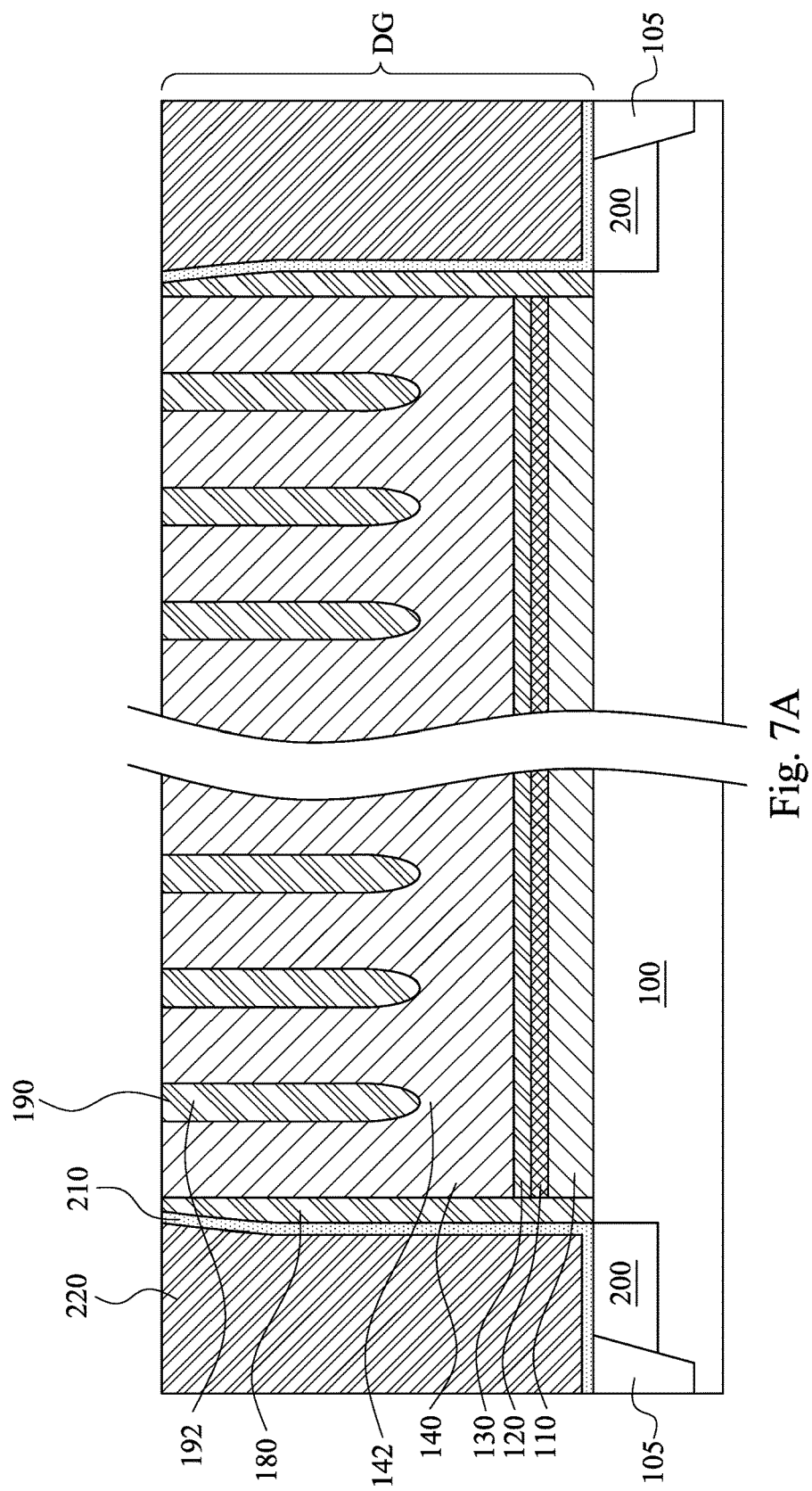
Figure 7B:
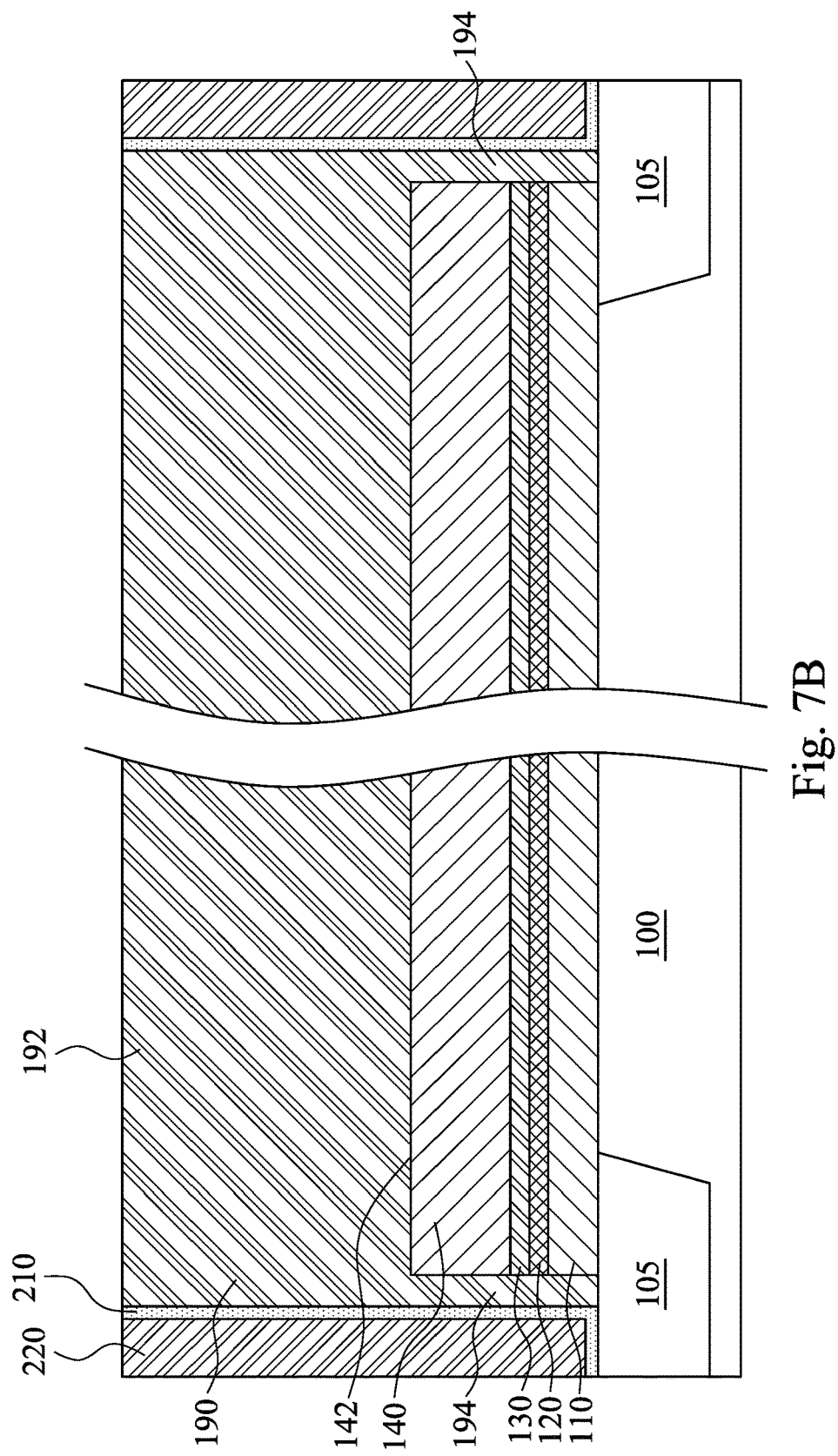

FIGS. 7A and 7B illustrate formation of a contact etch stop layer (CESL) 210 and an interlayer dielectric (ILD) layer 220, wherein FIG. 7A is a cross-sectional view taken along line A as shown in FIG. 2, and FIG. 7B is a cross-sectional view taken along line B as shown in FIG. 2. As illustrated, the CESL 210 is blanket formed on the structure shown in FIGS. 6A and 6B, and then, the ILD layer 220 is formed on the CESL 210. Afterwards, a CMP process may be performed to remove excessive material of the ILD layer 220 and the CESL 210 and to remove the mask layers 150 and 160, and hence the dummy gate electrode 140 can be exposed to a subsequent dummy gate removal process. The CMP process may planarize a top surface of the ILD layer 220 with top surfaces of the dummy gate electrode 140, gate spacers 180, dielectric structures 190 and the CESL 210 in some embodiments. The CESL 210 includes silicon nitride, silicon oxynitride or other suitable materials. The CESL 210 can be formed using, for example, plasma enhanced CVD, low pressure CVD, ALD or other suitable techniques. The ILD layer 220 may include a material different from the CESL 210. In some embodiments, the ILD layer 220 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 220 may be formed using, for example, CVD, ALD, spin-on-glass (SOG) or other suitable techniques.

Figure 8A:
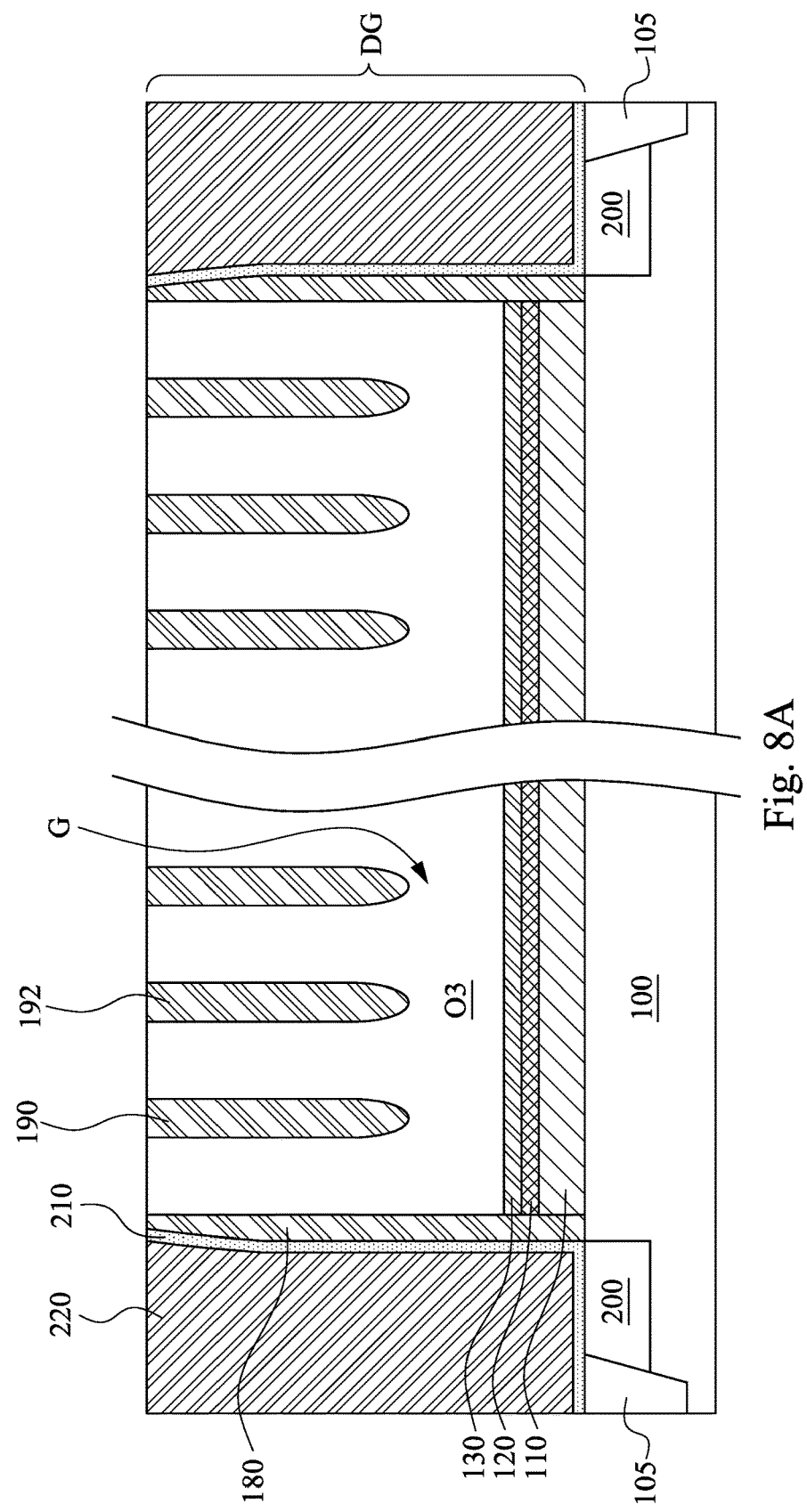
Figure 8B:
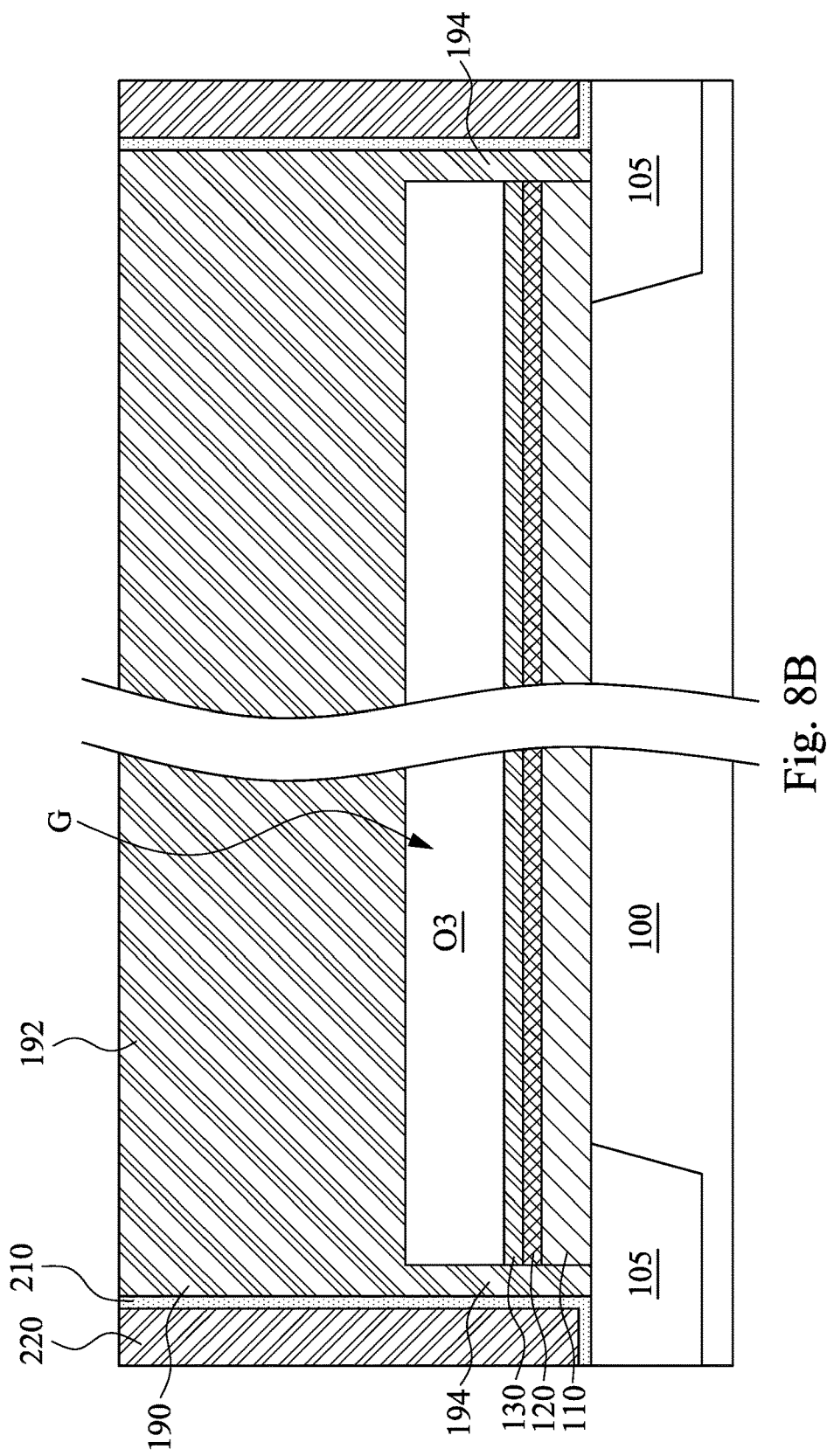

FIGS. 8A and 8B illustrate removal of the dummy gate electrode 140, wherein FIG. 8A is a cross-sectional view taken along line A as shown in FIG. 2, and FIG. 8B is a cross-sectional view taken along line B as shown in FIG. 2. As illustrated, the dummy gate electrode 140 is removed to form an opening O3 with the gate spacers 180 as its sidewalls. In some embodiments, the dummy gate electrode 140 is removed by a suitable etching process, such as dry etching, wet etching or combinations thereof. In some embodiments, the dry etching process for removing the dummy gate electrode 140 may use an etching gas such as $CF_4$, Ar, $NF_3$, $Cl_2$, He, HBr, $O_2$, $N_2$, $CH_3F$, $CH_4$, $CH_2F_2$, or combinations thereof.

As illustrated in FIG. 8B, the second portions 194 of the dielectric structures 190 are supported by the isolation dielectric 105, and hence the first portions 192 will not fall down when the dummy gate electrode 140 is removed. Therefore, after removal of the dummy gate electrode 140, the first portions 192 are separated from the underlying capping layer 130 by a gap G.

Figure 9A:
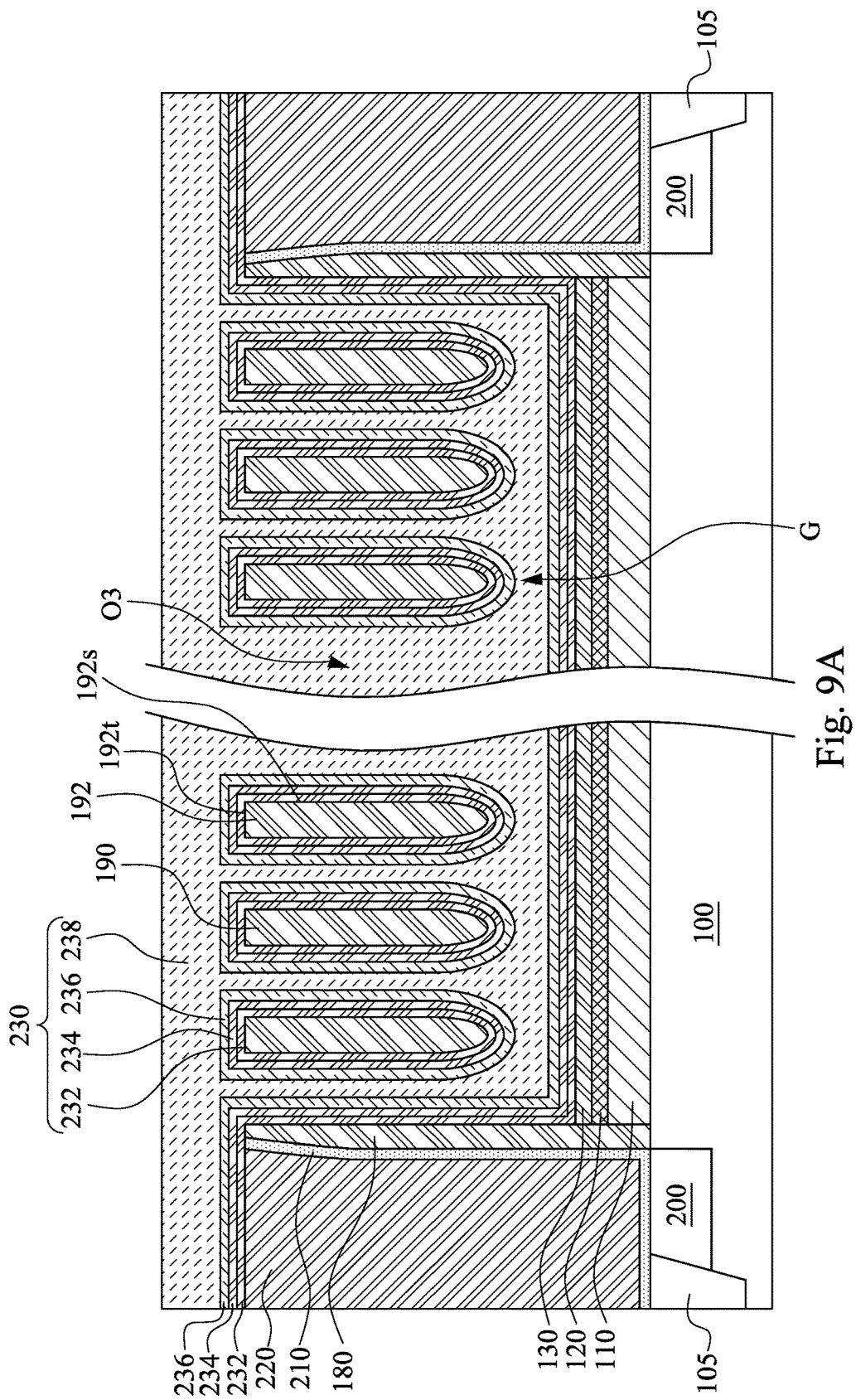
Figure 9B:
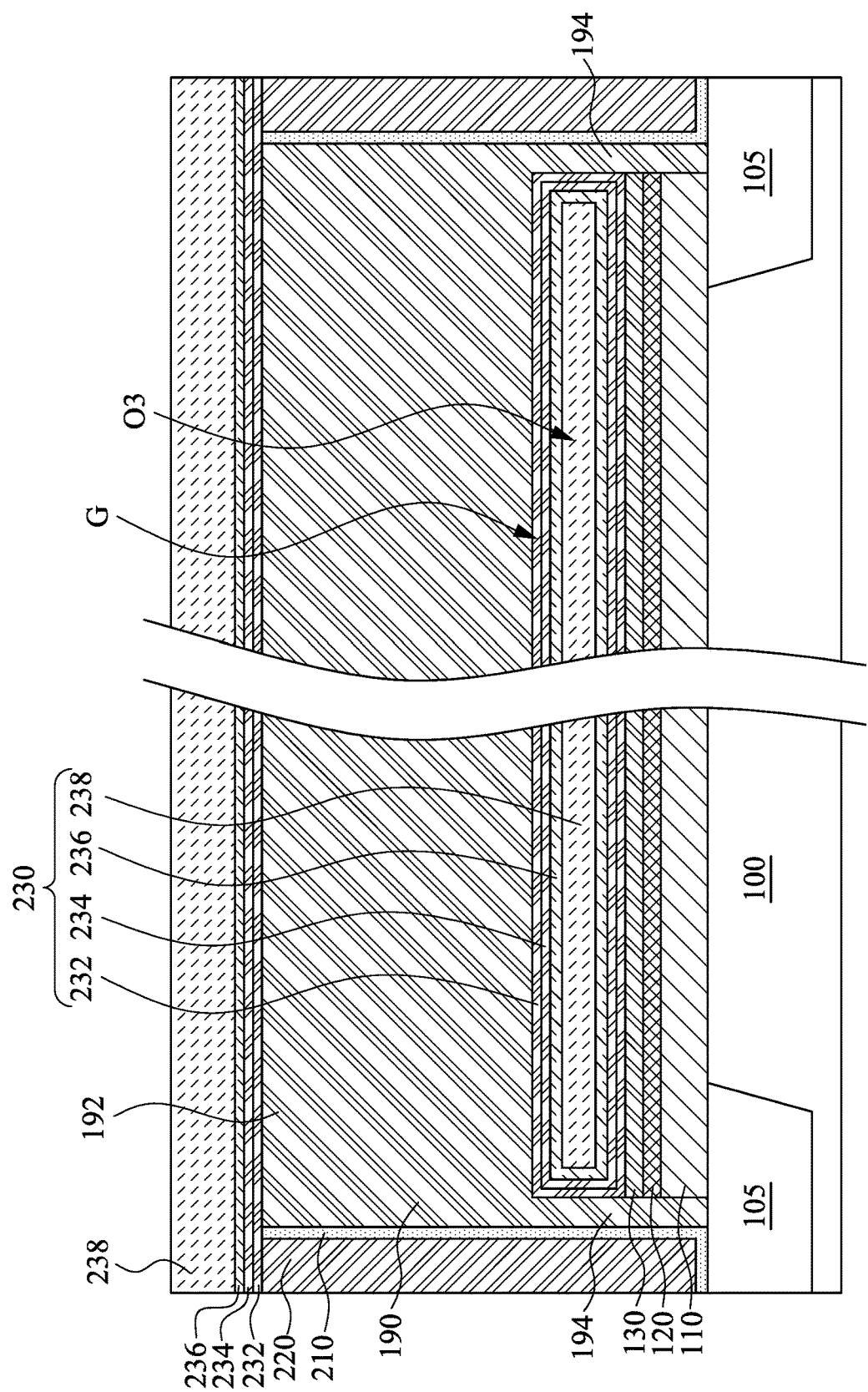

FIGS. 9A and 9B illustrate formation of a gate metal 230 over the semiconductor substrate 100, wherein FIG. 9A is a cross-sectional view taken along line A as shown in FIG. 2, and FIG. 9B is a cross-sectional view taken along line B as shown in FIG. 2. The gate metal 230 overfill the opening O3 so that the gate spacers 180, the dielectric structures 190, the CESL 210 and the ILD layer 220 are covered by the excess gate metal 230. Formation of the gate metal 230 comprises suitable deposition techniques, such as ALD, CVD, PVD, remote plasma CVD (RPCVD), plasma enhanced CVD (PECVD), metal organic CVD (MOCVD), sputtering, plating, other suitable processes, or combinations thereof.

The gate metal 230 may have a single layer structure or a multi-layer structure including a plurality of metal layers, which is schematically illustrated using reference notations 232, 234, 236 and 238. For example, the layer 232 formed over the capping layer 130 may act as a diffusion barrier layer. In some embodiments, the diffusion barrier layer 232 includes TiN, TaN, or composite layers thereof.

Layers 234 and 236 can act as work function layers having work function metals to provide suitable work function for the gate metal 230. A work function higher than the mid-gap work function (about 4.5 eV) that is in the middle of the valance band and the conduction band of silicon is referred to as a P-work function, and the respective metal having the P-work function can be referred to as a P-work function metal. On the contrary, a work function lower than the mid-gap work function is referred to as an N-work function, and the respective metal having the N-work function can be referred to as an N-work function metal. Examples of P-work function metal include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. Examples of N-type work function metal include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In some embodiments, the layer 234 is a TiN layer, and the layer 236 is a TiAl layer over the TiN layer.

The layer 238 can act as a filling metal that fills the remaining opening O3 after deposition of the layers 232, 234 and 236. The layer 238 may exemplarily include, but are not limited to, aluminum, tungsten, copper, nickel, cobalt, titanium, tantalum, titanium nitride, tantalum nitride, nickel silicide, cobalt silicide, TaC, TaSiN, TaCN, TiAl, TiAlN, or other suitable materials.

As illustrated in FIG. 9A, the first portions 192 of the dielectric structures 190 are respectively enclosed by portions of the layer 232, these portions of the layer 232 are respectively enclosed by portions of the layer 234, and these portions of the layer 234 are respectively enclosed by portions of the layer 236. Therefore, layers 232, 234, 236 and 238 are stacked on a sidewall 192s of the first portion 192 of the dielectric structure 190, and are also stacked on a top surface 192t of the dielectric structure 190. The top surface 192t can also be referred to as a dielectric surface herein. In some embodiments, widths of the layers 232, 234, 236 and 238 on the sidewall 192s of dielectric structure 190 are less than a width of the dielectric structure 190. As illustrated in FIG. 9B, portions of the layers 232, 234, 236 and 238 are filled into the gap G between the first portion 192 and the capping layer 130, and these portions of layers 232, 234, 236 and 238 in the gap G are wrapped by the dielectric structure 190.

Figure 10:
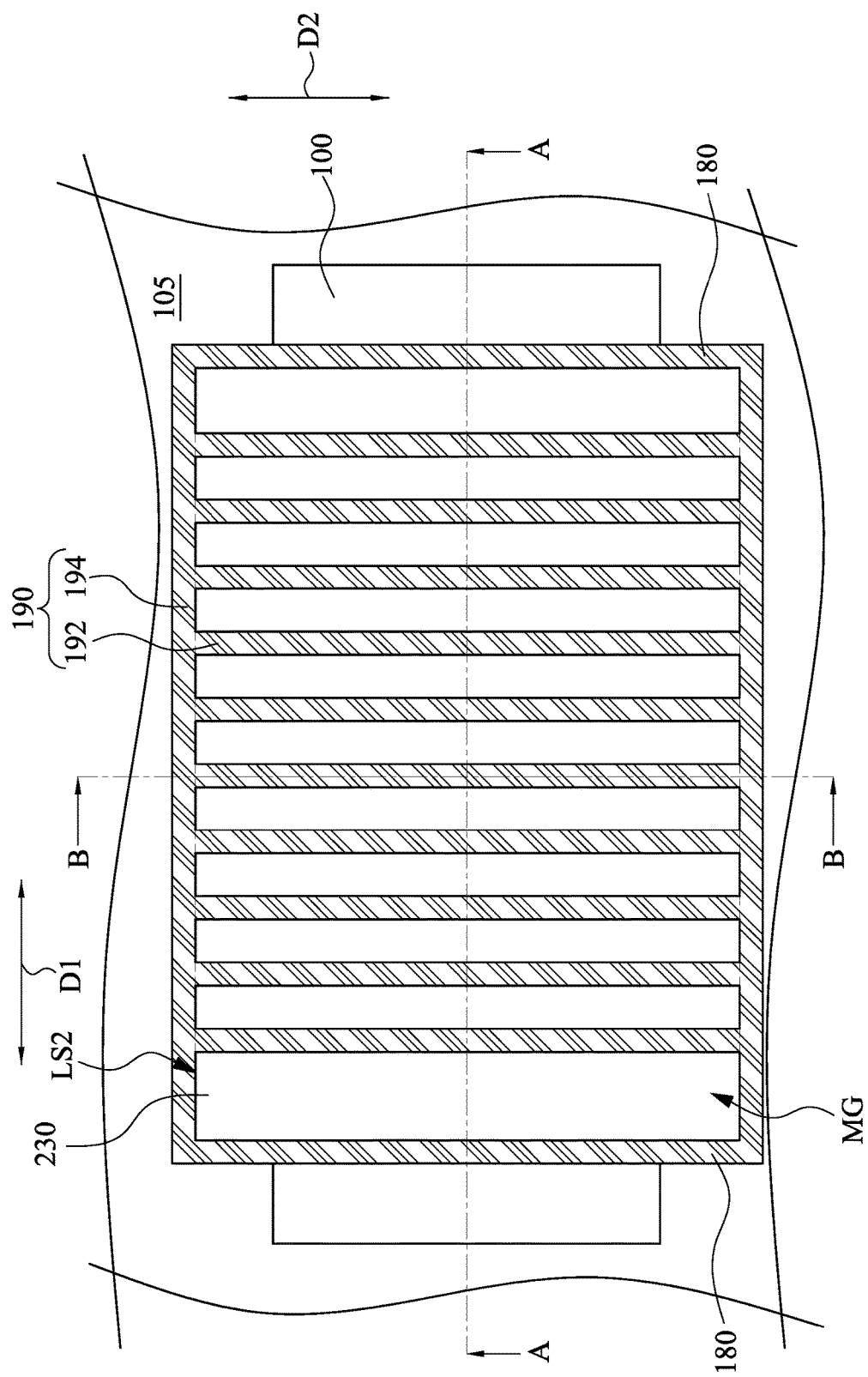
Figure 11A:
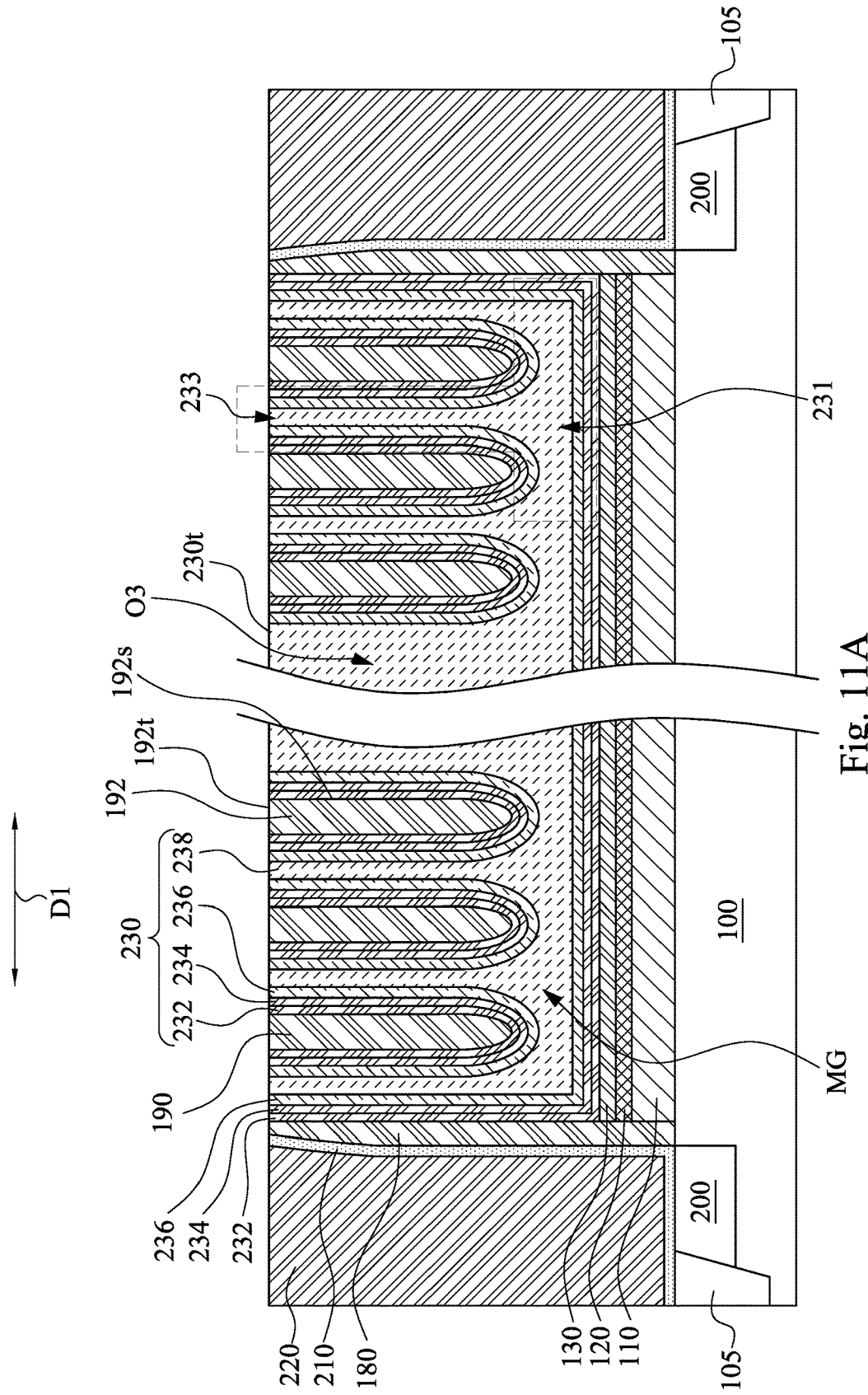
Figure 11B:
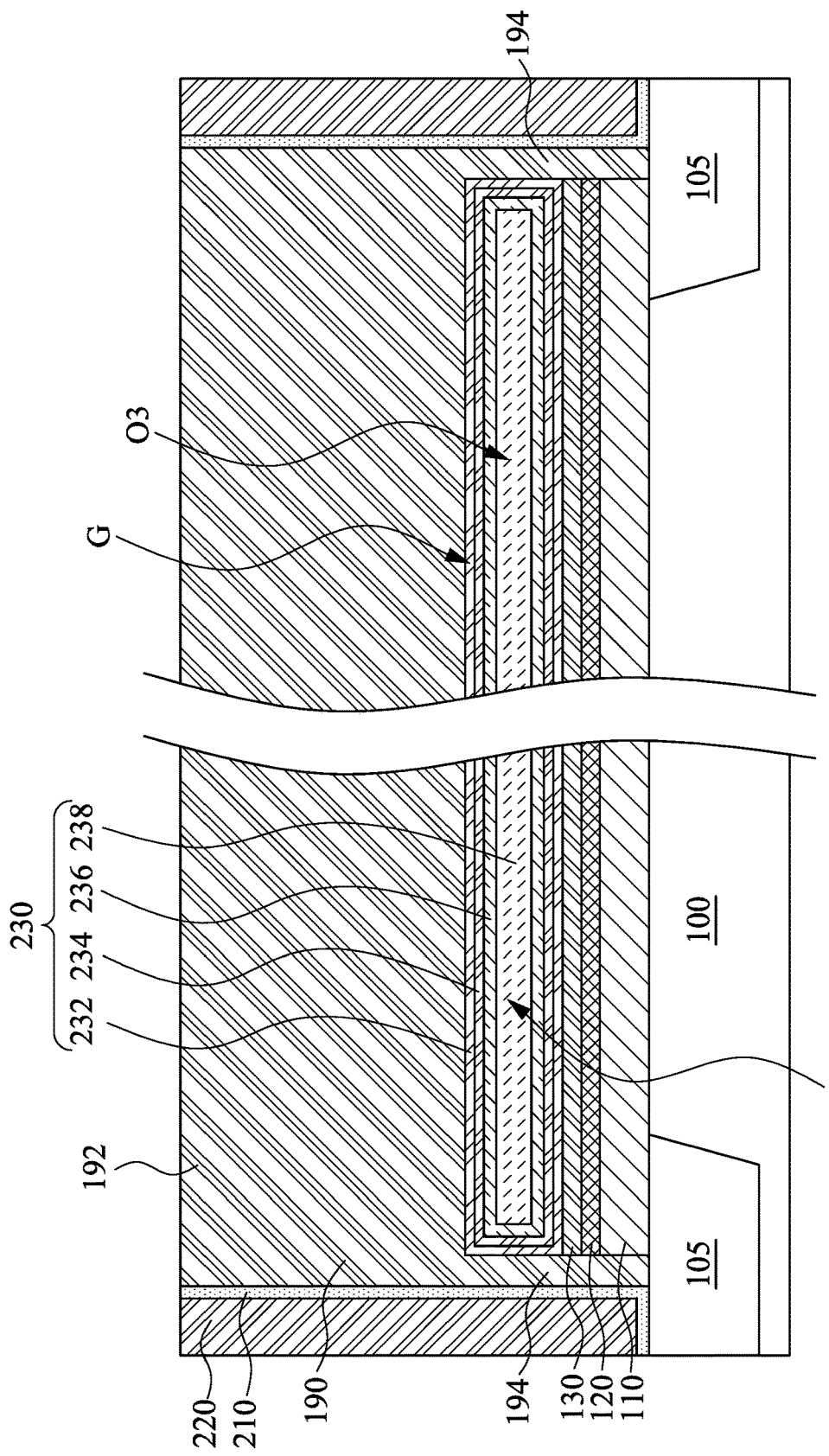

FIG. 10 is a plan view of a semiconductor device after planarization of the gate metal 230, FIG. 11A is a cross-sectional view of the semiconductor device taken along line A in FIG. 10, and FIG. 11B is a cross-sectional view of the semiconductor device taken along line B in FIG. 10. A CMP process is performed to remove excess gate metal 230 outside the opening O3 between the gate spacers 180, and the remaining gate metal 230 can be referred to as a metal gate structure MG in some embodiments. The CMP process can be performed at least until the gate spacers 180 and the dielectric structures 190 are exposed. After the CMP process, the dielectric structures 190 are embedded in a top surface 230t of the metal gate structure MG, and the top surfaces 192t of the dielectric structures 190 are not covered by the metal layers 232, 234, 236 and 238. Since other surfaces (e.g. sidewall 192s) of the first portions 192 of the dielectric structures 190 are still covered by the stacked layers 232-238, the first portions 192 can wrapped by the stacked layers 232-238.

Since the CMP process involves using a polishing pad, which could bend and result in dishing of large metal areas. This is also referred to as a CMP loading effect. Due to a large gate length of the metal gate structure MG, severe dishing would occur to result in significant loss of the metal gate structure MG. Therefore, in some embodiments, the dielectric structures 190 have a higher CMP resistance to the CMP process than that of the metal gate structure MG. For example, the dielectric structures 190 formed of the spacer material, such as silicon nitride, can have a higher CMP resistance to the CMP process than that of the metal gate structure MG. Specifically, in some embodiments, the dielectric structures 190 may have a greater hardness or a higher resistance to acidic solutions in slurry used in the CMP process than that of the metal gate structure MG. Therefore, the polishing rate of the dielectric structures 190 is relatively slow compared to the polishing rate of the metal gate structure MG. As a result, the dielectric structures 190 can be referred to as CMP resistant structures in some embodiments. With insertion of the dielectric structures 190 into the metal gate structure MG with a long gate length, the CMP process will not be performed to a large continuous metal area, and hence the CMP dishing effect can be reduced.

Since the polishing rate of the dielectric structures 190 is relatively slow compared to the polishing rate of the metal gate structure MG, top surfaces 192t of the dielectric structures 190 are in positions not lower than the top surface 230t of the metal gate structure MG. In other words, the top surface 230t of the metal gate structure MG is in a position not higher than top surfaces 192t of the dielectric structures 190. In some embodiments, the top surface 230t of the metal gate structure MG can also be referred to as a metal surface or a top metal surface.

As illustrated in FIGS. 10 and 11A, in some embodiments, the first portions 192 of the dielectric structures 190 are arranged along a lengthwise direction D1 of the metal gate structure MG. Stated differently, the first portions 192 of the dielectric structures 190 are arranged in a line crossing the gate spacers 180. A portion of the metal gate structure MG is in between two neighboring first portions 192 of the dielectric structures 190. In some embodiments, the metal gate structure MG includes a base portion 231 and a plurality of fins 233 protruding from the base portion 231, and the first portion 192 of the dielectric structure 190 is in between two neighboring fins 233 of the metal gate structure MG. More particularly, the first portions 192 of the dielectric structures 190 and the fins 233 of the metal gate structure MG are arranged in an alternating manner along the lengthwise direction D1 of the metal gate structure MG. As a result, the CMP dishing effect can be further reduced.

In some embodiments, lengthwise directions D2 of the first portions 192 of the dielectric structures 190 are different from the lengthwise direction D1 of the metal gate structure MG. For example, as illustrated in FIG. 10, the lengthwise directions D2 of the first portions 192 are substantially perpendicular to the lengthwise direction D1 of the metal gate structure MG. Moreover, the dielectric structures 190 span two opposite long sides LS2 of the metal gate structure MG. In other words, the dielectric structures 190 extend across the long sides LS2 of the metal gate structure MG. By such a configuration, the CMP dishing effect occurring on the metal gate structure MG with the long gate length can be further reduced.

HV device is used as an example above to illustrate issues of CMP dishing and mechanisms to solve the issue. As mentioned above, other devices, such as analog devices or RF devices, may also suffer from similar dishing issue for long gate devices. Therefore, embodiments of dielectric structures described above may also be used for other long gate devices. The issue of dishing becomes more pronounced for a number of long gate structures. Any types of long gate structures, not limited to HV devices, may benefit from using the dielectric devices described.

Embodiments of the present disclosure may have at least following advantages. Since the dielectric structures embedded in the metal gate structure have a CMP resistance property different from that of the metal gate structure, the dielectric structures can act as CMP resistant structures during the CMP process performed to the metal gate structure. As a result, the CMP dishing effect tending to occur on a metal gate structure with a long gate length can be reduced.

In accordance with some embodiments of the present disclosure, a semiconductor device includes a semiconductor substrate, a gate structure and at least one CMP resistant structure. The gate structure is over the semiconductor substrate. The CMP resistant structure is embedded in a top surface of the gate structure. The CMP resistant structure has a CMP resistance property different from a CMP resistance property of the gate structure.

In accordance with some embodiments of the present disclosure, a semiconductor device includes a semiconductor substrate, a plurality of gate spacers, a gate structure and at least one dielectric structure. The gate spacers are over the semiconductor substrate. The gate structure is over the semiconductor substrate and between the gate spacers. The dielectric structure is embedded in a top surface of the gate structure. The dielectric structure and the gate spacers have the same material.

In accordance with some embodiments of the present disclosure, a method of forming a semiconductor device includes forming a trench in a top surface of a dummy gate electrode over a semiconductor substrate, forming a CMP resistant structure over the semiconductor substrate, wherein a portion of the CMP resistant structure is formed into the trench, removing the dummy gate electrode to form a gap between the CMP resistant structure and semiconductor substrate, forming a gate metal into the gap at least until a top surface of the CMP resistant structure is covered by the gate metal, and performing a CMP process to the gate metal at least until the CMP resistant structure is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a gate structure over the semiconductor substrate; and
a plurality of chemical mechanical polish (CMP) resistant structures embedded in a top surface of the gate structure, the CMP resistant structures having a CMP resistance property different from a CMP resistance property of the gate structure,
wherein the gate structure comprises a base portion and a plurality fins protruding from the base portion, and each of the fins is connected to the base portion,
wherein the CMP resistant structures and the fins are arranged in an alternating manner along a first lengthwise direction,
wherein the CMP resistant structures extend along a second lengthwise direction which is different from the first lengthwise direction.

2. The semiconductor device of claim 1, wherein the CMP resistant structures have a top surface in a position not lower than the top surface of the gate structure.

3. The semiconductor device of claim 1, wherein the top surface of the gate structure is a metal surface, and wherein the CMP resistant structures have a dielectric surface in a position not lower than the metal surface.

4. The semiconductor device of claim 1, wherein the gate structure comprises metal layers, and wherein the metal layers are stacked on a sidewall of the CMP resistant structures.

5. The semiconductor device of claim 4, wherein at least one of the metal layers has a width less than a width of the CMP resistant structures.

6. The semiconductor device of claim 1, wherein the first lengthwise direction is substantially perpendicular to the second lengthwise direction.

7. The semiconductor device of claim 6, further comprising a plurality of gate spacers which are connected to the CMP resistant structures, wherein the gate spacers have bottom ends in contact with an isolation dielectric or the semiconductor substrate.

8. The semiconductor device of claim 7, wherein a top surface of the fins is in a position not higher than top surfaces of the CMP resistant structures.

9. The semiconductor device of claim 6, wherein the base portion is disposed between the CMP resistant structures and the semiconductor substrate.

10. The semiconductor device of claim 1, wherein the CMP resistant structures span long sides of the gate structure.

11. The semiconductor device of claim 1, wherein a portion of the gate structure under the CMP resistant structures is wrapped by the CMP resistant structures.

12. A semiconductor device, comprising:
 a semiconductor substrate;
 a plurality of gate spacers over the semiconductor substrate;
 a gate structure over the semiconductor substrate and between the gate spacers; and
 at least one dielectric structure embedded in a top surface of the gate structure, the dielectric structure and the gate spacers having the same material,
 wherein the gate structure comprises a base portion and a plurality of fins protruding from the base portion, and each of the fins is connected to the base portion,
 wherein the base portion is disposed between the at least one dielectric structure and the semiconductor substrate,
 wherein a number of the dielectric structure is plural and the dielectric structures extend along a first lengthwise direction, and
 wherein the gate spacers extend along a second lengthwise direction different from the first lengthwise direction and are connected to the dielectric structures.

13. The semiconductor device of claim 12, wherein the dielectric structures and the fins are arranged in an alternating manner along the second lengthwise direction.

14. The semiconductor device of claim 12, wherein the gate structure comprises stacked layers wrapping at least one of the dielectric structures.

15. The semiconductor device of claim 14, wherein a top surface of at least one of the dielectric structures is not covered by the stacked layers.

16. The semiconductor device of claim 12, wherein a top surface of the portion of the gate structure is in a position not higher than a top surface of at least one of the dielectric structures.

17. The semiconductor device of claim 12,
 wherein the gate spacers have bottom ends in contact with an isolation dielectric or the semiconductor substrate.

18. A method of forming a semiconductor device, comprising:
 forming a trench in a top surface of a dummy gate electrode over a semiconductor substrate;
 forming a chemical mechanical polish (CMP) resistant structure and a plurality of gate spacers over the semiconductor substrate, wherein a portion of the CMP resistant structure is formed into the trench, and the gate spacers are connected to the CMP resistant structure and have bottom ends in contact with an isolation dielectric or the semiconductor substrate;
 removing the dummy gate electrode to form a gap between the CMP resistant structure and the semiconductor substrate;
 forming a gate metal into the gap at least until a top surface of the CMP resistant structure is covered by the gate metal; and
 performing a CMP process to the gate metal at least until the CMP resistant structure is exposed.

19. The method of claim 18, wherein the CMP resistant structure has a CMP resistance to the CMP process higher than that of the gate metal.

20. The method of claim 18, wherein the forming the CMP resistant structure comprises:
 forming a dielectric layer over the semiconductor substrate;
 removing a portion of the dielectric layer while leaving portions of the dielectric layer as the gate spacers and leaving a portion of the dielectric layer as the CMP resistant structure; and
 forming source and drain regions respectively adjacent to the gate spacers.

* * * * *